(12) United States Patent
Husher

(10) Patent No.: US 6,753,592 B1
(45) Date of Patent: Jun. 22, 2004

(54) MULTI-TECHNOLOGY COMPLEMENTARY BIPOLAR OUTPUT USING POLYSILICON EMITTER AND BURIED POWER BUSS WITH LOW TEMPERATURE PROCESSING

(75) Inventor: John Durbin Husher, Santa Clara, CA (US)

(73) Assignee: Micrel, Inc., San Jose, CA (US)

( * ) Notice: Subject to any disclaimer, the term of this patent is extended or adjusted under 35 U.S.C. 154(b) by 0 days.

(21) Appl. No.: 10/236,371

(22) Filed: Sep. 6, 2002

(51) Int. Cl.[7] .................. H01L 31/072; H01L 29/82; H01L 29/00
(52) U.S. Cl. .................. 257/557; 257/556; 257/559; 257/197; 257/565; 257/560; 257/423
(58) Field of Search .................. 257/556–557, 257/559–560, 197, 423, 565, 576, 578, 519

(56) References Cited

U.S. PATENT DOCUMENTS

| | | | | |
|---|---|---|---|---|
| 4,749,661 A | * | 6/1988 | Bower | 437/33 |
| 6,118,135 A | * | 9/2000 | Gonzalez et al. | 257/3 |
| 6,566,733 B1 | * | 5/2003 | Husher et al. | 257/557 |

* cited by examiner

*Primary Examiner*—George Eckert
*Assistant Examiner*—Joseph Nguyen
(74) *Attorney, Agent, or Firm*—Sawyer Law Group LLC

(57) ABSTRACT

A dual polysilicon emitter, complementary output is provided which utilizes a buried power buss. While providing these advantages, the process is not complicated. The process has the speed performance of the ASSET technology with an easier process to produce. In addition, the process described in the present invention provides additional advantages that the ASSET process does not have.

7 Claims, 13 Drawing Sheets

CMOS With Slots - Oxidized and Metal Filled

CMOS With Buried Power Buss Slots

Bipolar
Complementary
Output Stage

Buried Layer and Epitaxial
on a P Substrate

Poly II N+ Emitter into Intrinsic
Base for Vertical NPN
Vertical NPN

Poly II P+ Emitter into N- Intrinsic
Base for Vertical PNP
Vertical PNP

Typical Oxidized Slots for Ground,
Power Buss and Sinker to Buried Layer

CMOS With Slots - Oxidized and Metal Filled

CMOS With Buried Power Buss Slots

Typical Oxidized Slots for Ground,
Buried Power Buss and Sinker to Buried Layer

Resist covers everything but
Sinker Slot - for N+ Implant

Resist Planar Etched.
Leaving Resist in Slots
Field Metal Etched Off

Resist Stripped & Second Metal 1B
Sputter Deposited

Metal - 1C in Slots and Interconnect
(Buried Power Buss)

Metal Contact to P+ Implant
to Grounded Substrate

Metal Contact to N+ Implant
to Buried Layer Substrate

Metal 1A/1B Ground Strap

Metal 1C Crossover of Ground when proceeding from one isolated area to an adjacent isolated area.

MULTI-TECHNOLOGY COMPLEMENTARY BIPOLAR OUTPUT USING POLYSILICON EMITTER AND BURIED POWER BUSS WITH LOW TEMPERATURE PROCESSING

FIELD OF THE INVENTION

The present invention relates generally to an integrated circuit process for providing a complementary bipolar output stage and more particularly to a process that utilizes a self-aligned poly (polysilicon) emitter and a buried power buss for such a stage.

BACKGROUND OF THE INVENTION

Bipolar Complementary Output Stages (BiCMOS) are used wherever possible in integrated circuits. The main reason being that no power is used unless a signal is present. This is very important in many applications where battery operation is used and power needs to be conserved. FIG. 1 represents a typical class B stage 10 using complementary outputs 12 with two power supplies 14 and 16. During positive signals the upper Q1 transistor 18 conducts and the bottom transistor is off. During negative going signals the lower Q2 transistor 20 conducts and the upper Q1 transistor 18 is off. There is some distortion in this circuit due to two main causes:

1. The PNP transistor does not have the gain that the NPN transistor has and for the same level of signal does not have the current output. This is due mainly to the mobility of the NPN transistor being higher than the PNP transistor.
2. During crossover from Q1 transistor 18 to Q2 transistor 20 conducting there is no current. This causes crossover distortion.

Accordingly, what is desired is to provide a process which overcomes the above identified problems. The process should be cost effective, easy to implement and compatible with existing processes. The process should be a broad use technology that can be utilized in bipolar, BiCMOS, BCD and other multiple type technologies. The present invention addresses such a need while providing a low temperature solution.

SUMMARY OF THE INVENTION

A dual polysilicon emitter, complementary output is provided which utilizes a self-aligned poly emitter process in conjunction with a buried power buss to provide many advantages. While providing these advantages, the process is a low temperature one that is not complicated. The low temperature process that is provided has some additional advantages. The process has the speed performance of the ASSET technology with an easier process to produce. In addition, the process described in the present invention provides additional advantages that the ASSET process does not have. Examples of these advantages include:

1. The bipolar, BCD and BiCMOS processes are essentially the same as the standard bipolar or BiCMOS processes being produced generally throughout the industry up through the deposition of polysilicon except that the isolation masking and diffusion process and the sinker masking and diffusion process steps are eliminated. These eliminated steps represent the longest time, highest temperature, and largest area consuming process steps in standard processing used throughout the industry. Their elimination is therefore a significant saving in the process throughput time and cost of making these devices.
2. The dual polysilicon emitter results in self-aligning structures for the extrinsic and intrinsic base, as well as the emitters.
3. The utilization of 0.5 $\mu$m line resolution or lower is encouraged, allowing the devices to perform at much higher frequencies. However, the process and technology is valid from 0.25 $\mu$m to >2.2 $\mu$m; and in many aspects should be used in 2.0 $\mu$m technologies. The process is ideal for analog functions where high current and high power are required and their related larger structures are required for carrying the higher current and the resulting dissipation of high power.
4. Beyond the dual polysilicon emitter process steps, the process is essentially the same as the conventional process except for the addition of etched slots to provide a buried power buss. This results in interconnect metal that at least doubles the metal thickness while only requiring thin metal interconnects to be etched and results in eliminating masks and process steps in the metalization process.
5. The slots utilized for the buried power buss are oxidized and provide oxide isolation instead of junction isolation, resulting in closer spacing, lower leakage, lower capacitance, higher voltage, lower metal resistance, improved electromigration, improved heat transfer, lower Ron, improved performance and a smaller die.
6. The combined process results in an integrated circuit with improved heat transfer capability over presently used processes.
7. Due to the self-aligned features of the process one is able to control critical dimensions with high precision thus allowing the PNP structure to be ratioed to the NPN structure very accurately and eliminating most of the class B distortion that is due to mismatch on present day structures.
8. The self alignment characteristics provided by the Polysilicon process and the structural advantages of the Buried Power Buss provide very low Ron X Area products. This lowers the power dissipation while allowing the matching of the PNP and NPN transistors to be precise. These combinations reduce the class B distortion of the complementary outputs.

DETAILED DESCRIPTION

Figure 1:
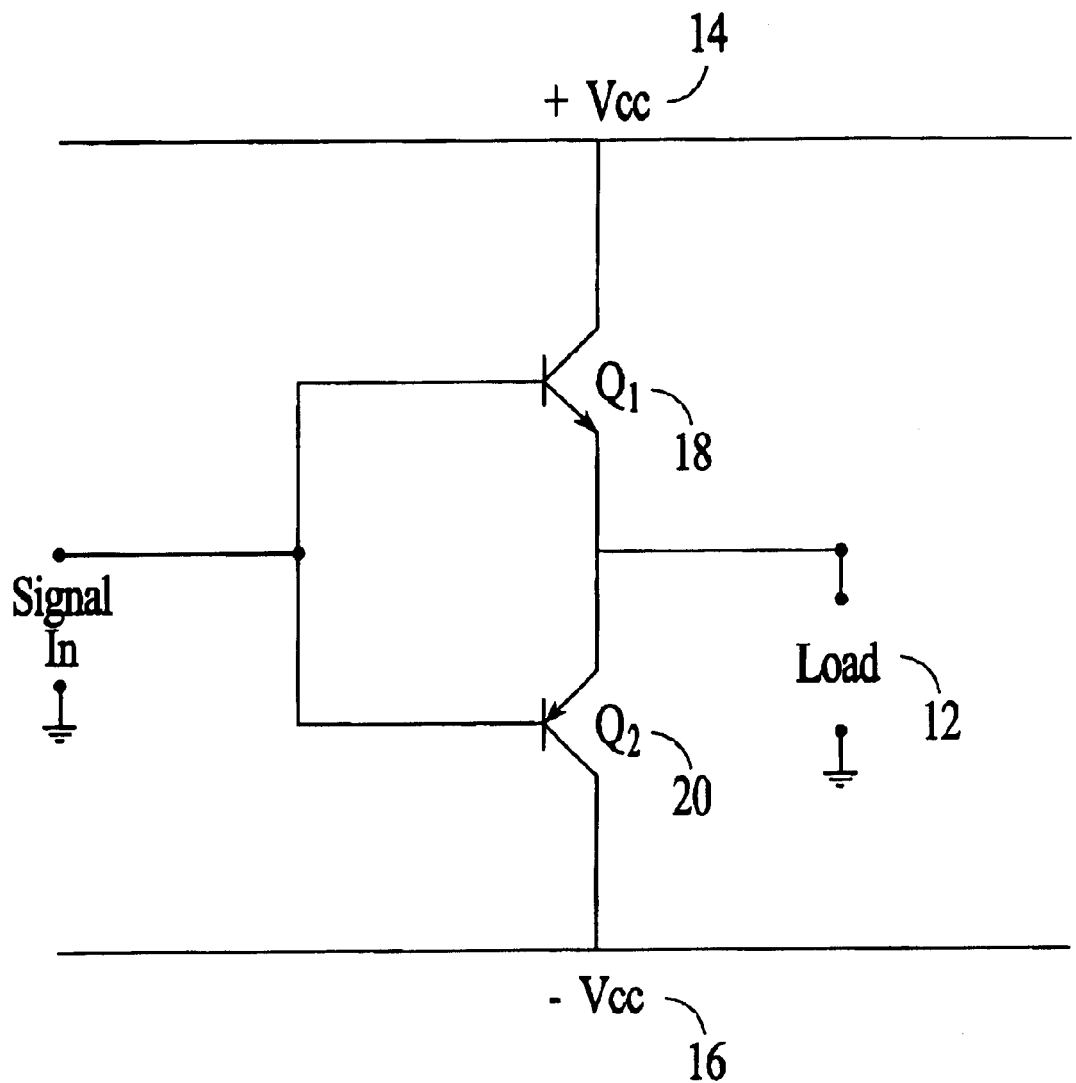
FIG. 1 represents a typical class B stage using complementary outputs with two power supplies.

The present invention relates generally to a process for providing a complementary bipolar output stage. More particularly, it describes a process and unique structures that combine the utilization of self-aligned poly emitters, extrinsic bases and intrinsic bases for both the NPN and PNP transistors; which when combined with a buried power buss, provides significant advantages. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

As before mentioned, conventional Bipolar complementary output stages have two major problems:

1. The PNP transistor does not have the gain that the NPN transistor has and for the same level of signal does not have the current output. This is due mainly to the mobility of the NPN transistor being higher than the PNP transistor.

2. During crossover from Q1 transistor 18 to Q2 transistor 20 conducting there is no current. This causes crossover distortion.

A system and method in accordance with the present invention overcomes the problems identified with conventional bipolar output stages.

The PNP transistor does not have the gain that the NPN transistor has and for the same level of signal does not have the current output. This is due mainly to the mobility of the NPN transistor being higher than the PNP transistor. In order to overcome this problem the PNP transistor must be made bigger (emitter—base cross sectional area) than the NPN by the same ratio as the mobility of the electrons in the NPN are greater than the mobility of the holes in the PNP. This mobility difference is a well known value and this process describes a precision way of ensuring the area of the PNP is made bigger by this ratio. A system and method in accordance with the present invention overcomes the problems identified with conventional bipolar output stages. The process and device in accordance with the present invention uses polysilicon to provide self aligned transistors (self aligned intrinsic and extrinsic bases as well as the polysilicon emitter) to provide the precise ratioing of the PNP to the NPN. This, in conjunction with a buried power buss providing low Ron values for the NPN and PNP devices, results in distortion being reduced to a negligible level. Since the control of the polysilicon width and length is very precise using present-day dry etching techniques, the polysilicon for the PNP transistor can be area ratioed to the NPN to compensate for the differences in mobility and provide a very good match. This results in the current signals being the same on the positive and negative going signals into the load. The buried power buss provides collector resistances that are very low on both the NPN and PNP and provides a very low resistance in the emitters, thus ensuring a good match and therefore low distortion in the output load.

During crossover from Q1 transistor 18 conducting to Q2 transistor 20 conducting there is no current. This causes crossover distortion. Prior designs used throughout the industry have shown that this crossover distortion can be reduced considerably by providing the circuit with a modest current bias to overcome this distortion. This previously proven approach would be followed in this, and any, design using the technology described herein.

Since the complementary output stage carries very high currents when responding to signals it is important that the Ron of both the NPN and PNP be low to reduce the power loss in the circuit and increase the efficiency. In addition, reducing the Ron of the stages results in improved matching and reduced distortion as indicated above. In a system and method in accordance with the present invention, the Ron and all resistances are reduced to a minimum. In addition, superior heat transfer is provided using the output power stage in accordance with the present invention thus providing additional margin in the matching requirements over wide temperature variations. These combinations result in very low biasing current flow during no signal and a capability of carrying very high current efficiently during the signal stage while running cooler than other approaches.

While achieving this superior output stage, the process provides a superior CMOS structure for the front end stages. This CMOS uses the same poly and buried power buss structures as the output stage to provide a very efficient, high frequency and low Ron CMOS device. The slots of the buried power buss are used to truncate various portions of the CMOS resulting in a smaller structure able to carry high currents with low Ron. The CMOS approach provides the smallest approach for achieving these current and voltage levels. This CMOS approach can be used in BiCMOS, BCD and other technologies where CMOS provides an advantage.

This CMOS process will be described in detail in a later section of this patent.

The process to be discussed is capable of providing an all bipolar approach, a BiCMOS approach, a BCD approach, a BiMos approach or various combinations of these and other technologies with no fundamental change in the basic process presently employed in their production. Only mask changes are required to accommodate the advantages of this process and its unique structures.

A complementary output technology will be discussed that will standardize on dual poly and single or double metal as the standard process in concert with a buried power buss. The reason for this dual Poly choice is so that the technology may be used for bipolar, CMOS, BiCMOS, BCD, EDLD-MOS and mixed technologies with the simplest processing for the end result obtained. The process is implemented using low temperatures which results in improved control. Because of the use of a buried power buss, dual metal is provided with essentially single metal processing and line definition. The use of dual polysilicon provides the freedom of taking advantage of self aligning features for the extrinsic and intrinsic base and polysilicon emitters in bipolar as well as providing the basic gate structure for the dual poly CMOS where it is used as the gate and a level of interconnects. The combined use of the buried power buss with the self aligned base and polysilicon emitters result in a much smaller die for a given function with significant advantages provided by the smaller die.

The buried power buss approach provides oxide isolated structures that will ensure high breakdown voltage, lower capacitance, low leakage, low Ron, high snap back voltage on vertical and lateral DMOS, significantly improved lateral PNP characteristics, low interconnect resistance, small chip size, and improved thermal characteristics.

1. Mobility

The process and device in accordance with the present invention uses polysilicon to provide self aligned transistors along with a buried power buss to give low Ron values resulting in the distortion associated with a complementary output being reduced to a negligible amount. A buried power buss approach is described in U.S. patent application Ser. No. 10/034,184, entitled "Buried Power Buss for High Current, High Power Semiconductor Devices and Method for Providing Same" and filed on Dec. 28, 2001, and is incorporated in its entirety herein. Since the control of the polysilicon width and length is very precise, the polysilicon for the PNP transistor can be ratioed to the NPN to compensate for the differences in mobility and provide a very good match. This results in the current signals being the same on the positive and negative going signals into the load. The buried power buss provides collector resistances that are very low on both the NPN and PNP and provides a very low resistance in the emitters, thus ensuring a good match and therefore low distortion in the output load.

2. Crossover Distortion

Since the Complementary Output Stage carries very high currents when responding to signals it is important that the Ron of both the NPN and PNP be low to reduce the power loss in the circuit and increase the efficiency. In a system and method in accordance with the present invention, the Ron and all resistances are reduced to a minimum. In addition superior heat transfer is provided using the output power stage in accordance with the present invention. These combinations result in essentially zero current flow during no signal and a capability of carrying very high current efficiently during the signal stage while running cooler than other approaches. Accordingly, the crossover distortion is minimized.

While achieving this superior output stage, the process also provides a superior CMOS structure for the front end stages. This CMOS uses the same polysilicon and buried power buss structures as the output stage to provide a very efficient, high frequency and low Ron device. The slots of the buried power buss are used to truncate various portions of the CMOS resulting in a smaller structure able to carry high currents with low Ron. The CMOS approach provides the smallest approach for achieving these current and voltage levels. This CMOS approach can be used in BiCMOS, BCD and other technologies where CMOS provides an advantage. This approach takes the present process and design rules being employed at a facility and, without changing the fundamental process, reduces the size of the CMOS structure by cutting off portions of the CMOS structure.

The process to be discussed is capable of providing an all bipolar approach, a BiCMOS approach, a BCD approach, a BiMos approach or various combinations of these and other technologies with no change in the basic process and only requiring changes in masks for the approach desired.

The complementary output technology can be utilized as a standard process on dual polysilicon and single or double metal in concert with a buried power buss. The process can be implemented using low temperatures which results in improved control. The use of a dual polysilicon provides the freedom of taking advantage of self aligning features for the extrinsic and intrinsic base and poly emitters in bipolar as well as providing the basic gate structure for the dual polysilicon CMOS where it is used as the gate and a level of interconnects. The combined use of the buried power buss with the self aligned base and polysilicon emitters results in a much smaller die for a given function with significant advantages provided by the smaller die.

The buried power buss approach provides oxide isolated structures that will ensure high breakdown voltage, lower capacitance, low leakage, low Ron, high snap back voltage on vertical and lateral DMOS, significantly improved lateral PNP characteristics, low interconnect resistance, small chip size, and improved thermal characteristics.

The utilization of the buried power buss provides dual metal while requiring single metal patterning and eliminates the need for additional metal layers in most applications while providing low cross talk on the ground lead, and low cross talk in the supply lead. It provides thick metal for the high current carrying structures while only requiring patterning and etching thin metal for the interconnect mask. This approach eliminates the long time, high temperature, area consuming isolation and sinker diffusions by providing slot oxide isolation and metal sinkers using the buried power buss approach. Using this technique eliminates any high temperature processing after the epitaxial layer is grown. The combination of using the self-aligned polysilicon emitters and bases along with the use of the buried power buss results in a very small die per function.

This combination provides the lowest Ron X area potential of any approach. This combination results in higher $F_t$s and higher $F_{max}$ than other approaches. The reduction in die size combined with the excellent heat transfer characteristics of the buried power buss result in very small die that are able to transfer heat better than other approaches. This allows the products designed with this concept to go into smaller packages which were previously not amenable because of their poor thermal impedance and/or the die size.

This patent will describe the process flow as well as the unique device structures for achieving superior characteristics such as those that have been detailed above.

Process Flow and Description

The process is the standard process presently used in the industry for integrated circuit bipolar devices up through the point where the base and emitter are to be processed. In this sequence of events the buried layer is standard using antimony implant and the resultant processes. The epitaxial process is standard. The isolation masking and diffusion is eliminated since a buried power buss metal with its oxide overcoat will penetrate the epitaxial layer and provide isolation via oxide. The oxidations are standard. The Sinker masking and high temperature diffusion are eliminated from the standard process resulting in a less expensive approach to providing a function.

If, besides the bipolar, a deep P, Pwell or Nwell is required for CMOS, DMOS, lateral PNP or any present technology then it would be inserted and completed as is presently done. These standard processes are utilized until the process for base and emitter (source and drain) of the NPN and PNP are required. Since this is to be a complementary bipolar output with poly emitters, a process using two layers of polysilicon to provide self alignment of the extrinsic and intrinsic base as well as the polysilicon emitters for the NPN and PNP is described in the following paragraphs.

Process Flow

Starting material is 100 P type material with resistivity determined by the application.

Buried layer—The buried layer is provided by the standard Antimony implant and high temperature, fairly long diffusion. In general, an 18–25 ohm sheet resistivity is obtained.

Figure 2:
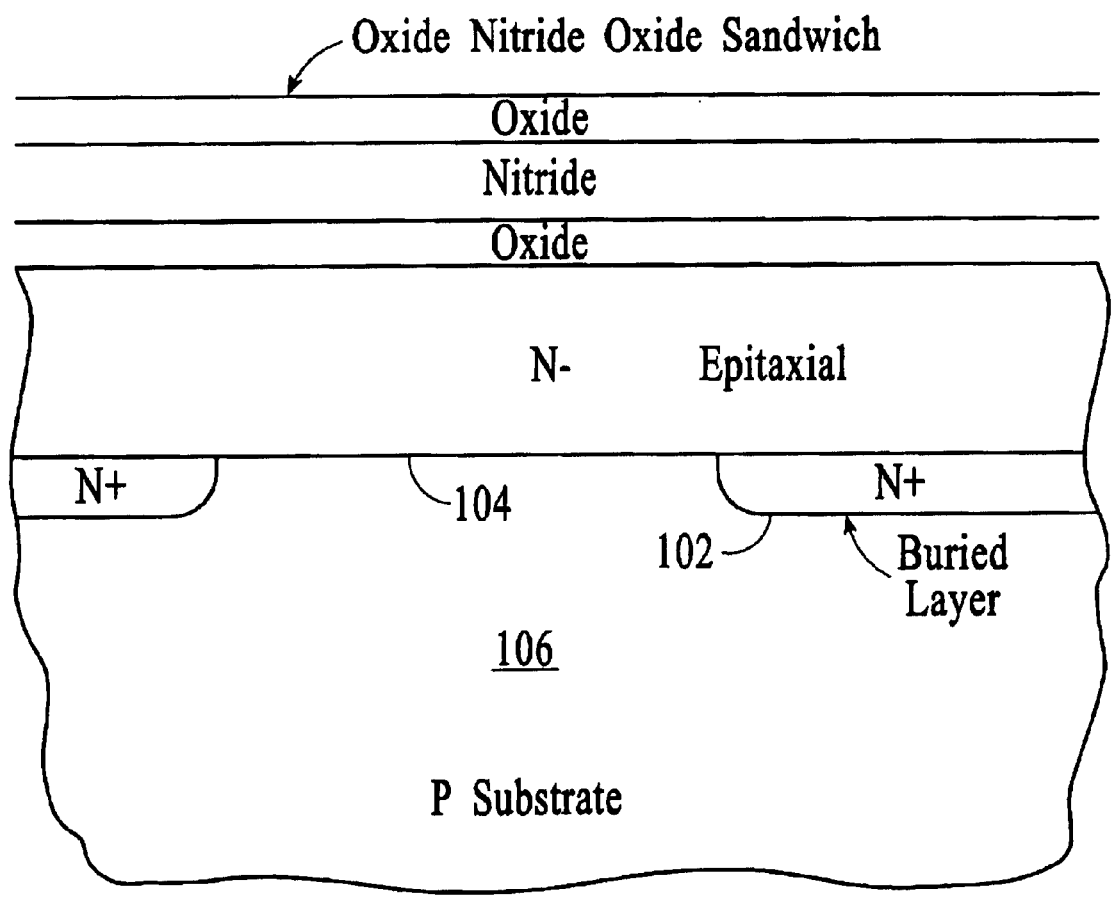
FIG. 2 represents cross section of a standard device up through the deposition of the oxide nitride oxide sandwich prior to isolation and field oxidation.

Epitaxial deposition—an N type epitaxial of a determined thickness is deposited. FIG. 2 illustrates a buried layer 102 and an epitaxial layer 104 on a P substrate 106. FIG. 2 represents a cross section of a standard device up through the deposition of the oxide nitride oxide sandwich prior to isolation and field oxidation. The thickness varies depending on the application. Thickness in general will vary from a little over one micron to six microns of approximately one ohm centimeter material.

Oxide Nitride Oxide (standard for given process) sandwich process is completed as shown in FIG. 2.

Active Area Mask: Resist is patterned over the ONO sandwich with the Active Area Mask and the field areas are patterned and etched.

Field Oxidation—The wafers are oxidized at temperatures between 900 C. and 1000 C. to provide a thickness of approximately 5,000 A to 10,000 A (depending on the design requirements) for the field oxide in the areas not protected by the Active Area ONO sandwich.

Etch Open the Active Area ONO sandwich—standard processing.

Grow thin sacrificial oxide—A thin controlled oxide is grown using standard processing. The oxide thickness depends on the product. This is a sacrificial oxide. The oxide is then etched away. A polysilicon deposition system should be ready to accept the wafers immediately after the oxide is dipped off and the wafer dried.

After this the vertical NPN device and the vertical PNP device are provided using the steps indicated below.

Poly 1 is deposited. The process and thickness would be the same as is used in a conventional single polysilicon emitter process.

Extrinsic P base mask, resist only—no etching, polysilicon to receive P dopant for extrinsic base of NPN transistor.

Boron is then implanted for the extrinsic base of the NPN in a higher concentration than the intrinsic base will receive to provide low sheet resistance external to the active base.

Figure 3A:
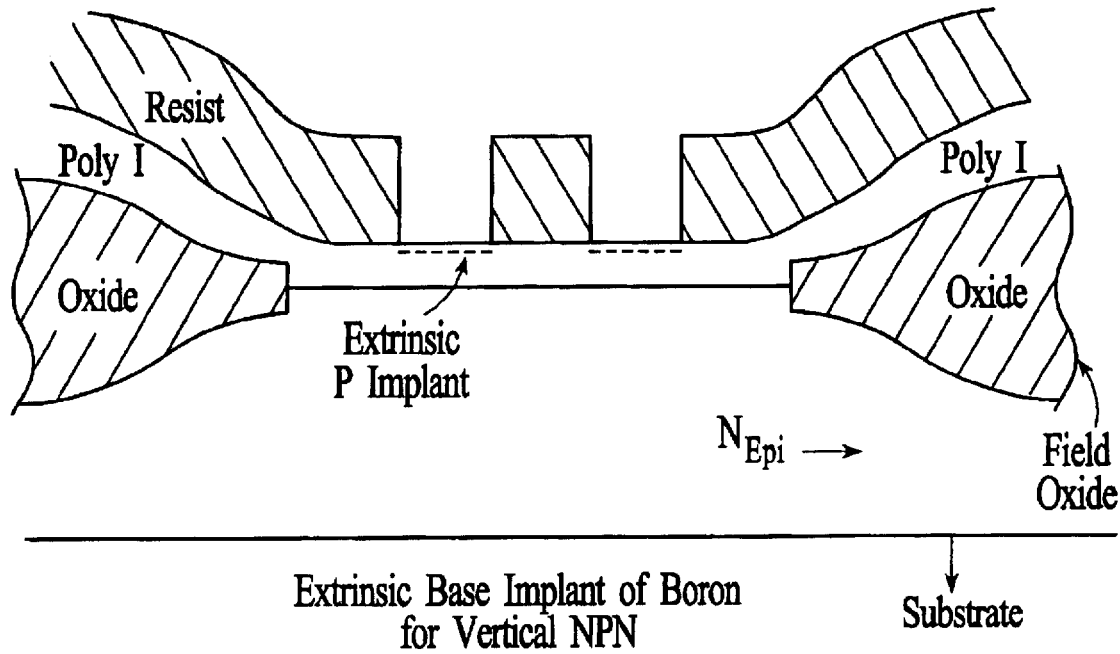
FIG. 3A is a cross section of a device just after poly 1 and prior to the extrinsic base implant of boron for the vertical NPN.

Resist is stripped, etc. FIG. 3A is a cross section of a device just after poly 1 and prior to the extrinsic base implant of boron for the vertical NPN.

Extrinsic N Base Mask, resist only—no etching, receives N dopant for the extrinsic base of the PNP transistor.

Figure 3B:
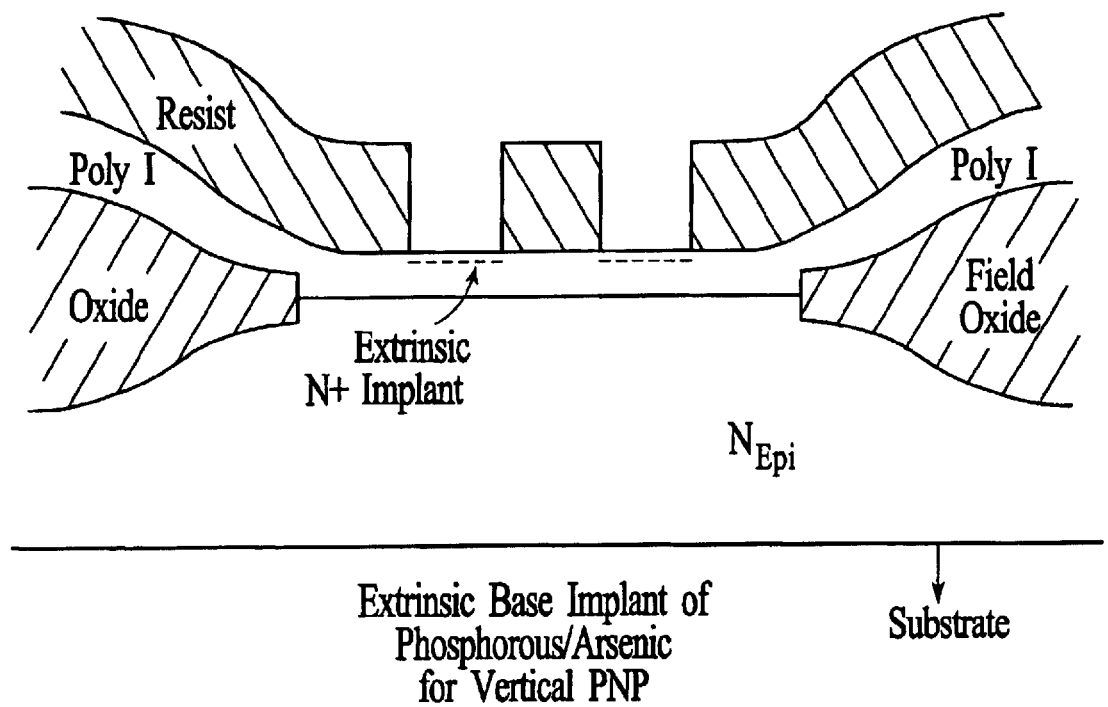
FIG. 3B is a cross section of a device just after poly 1 and prior to the extrinsic base implant of phosphorus/arsenic for the vertical PNP.

N dopant is implanted for the extrinsic base of the PNP in a higher concentration than the intrinsic base will receive to provide low sheet resistance external to the active base. Resist is stripped, etc. FIG. 3B is a cross section of a device just after poly 1 and prior to the extrinsic base implant of phosphorus/arsenic for the vertical PNP.

Figure 4A:
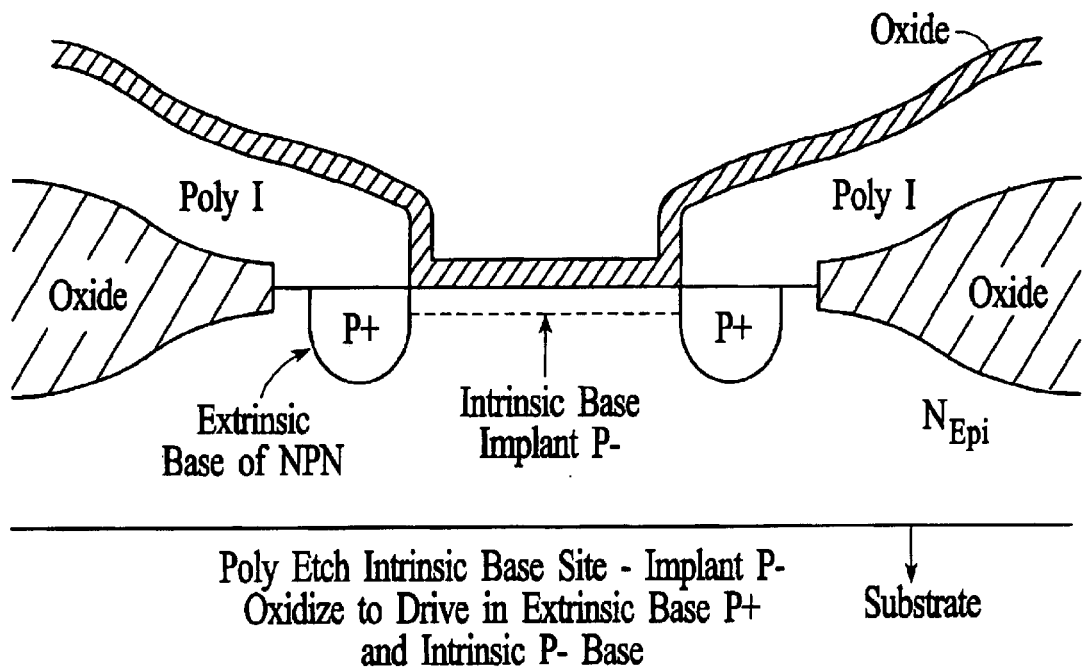
FIG. 4A is a cross section of the device after poly 1 etch, the extrinsic base diffusion of the P+ extrinsic base of the NPN and the self aligned intrinsic P– base of the vertical NPN transistor.
Figure 4B:
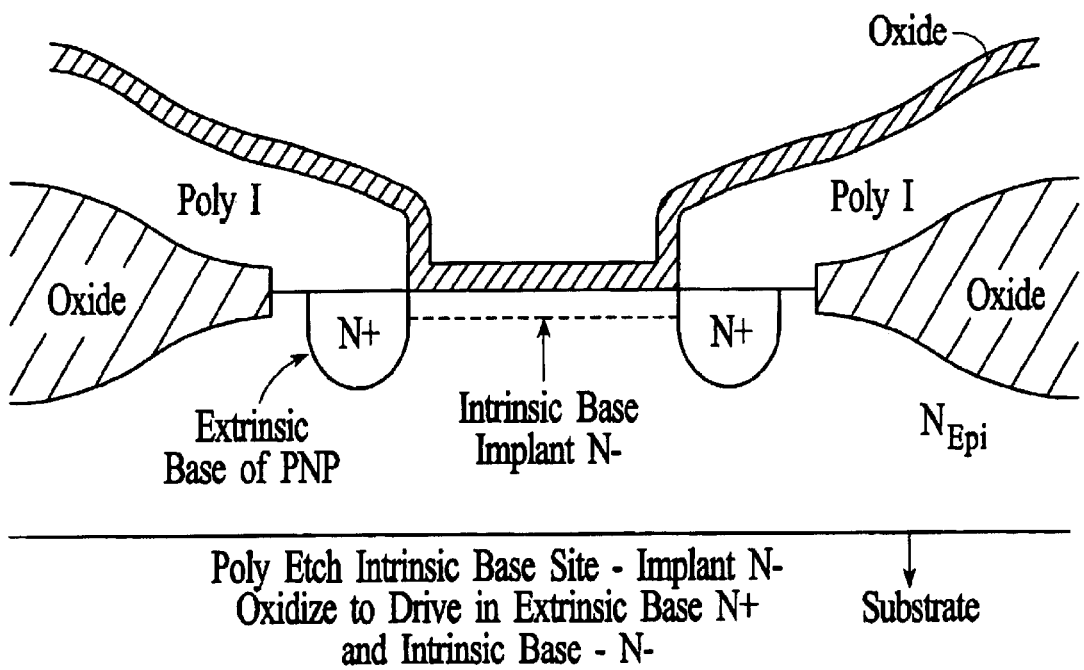
FIG. 4B is a cross section of the device after poly 1 etch, the extrinsic base diffusion of the N+ extrinsic base of the PNP and the self aligned intrinsic N– base of the vertical PNP transistor.

Intrinsic Base Mask: All areas are masked except where the intrinsic base is to be located. Polysilicon 1 is etched in locations where the intrinsic base will be on NPN and PNP. This will automatically align the intrinsic base to the extrinsic base. See FIGS. 4A and 4B. FIG. 4A is a cross section of the device after poly 1 etch, the extrinsic base diffusion of the P+ extrinsic base of the NPN and the self-aligned intrinsic P– base of the vertical NPN transistor. FIG. 4B is a cross section of the device after poly 1 etch, the extrinsic base diffusion of the N+ extrinsic base of the PNP and the self-aligned intrinsic N– base of the vertical PNP transistor.

Oxidize—to drive in the extrinsic base, oxidize polysilicon and oxidize intrinsic base region. FIGS. 4A and 4B illustrate the intrinsic base implant for the P__Base and the N__base.

Oversize intrinsic P base mask—leaves resist everywhere but at the locations of the NPN intrinsic base.

Next, boron is implanted into intrinsic base of NPN. Resist is stripped and RTA (rapid thermal annealing) processing is provided to activate the implants.

Oversize intrinsic N base mask—leaves resist everywhere but at the locations of the PNP intrinsic base.

N type dopant is implanted into the intrinsic base of PNP. Resist is stripped and RTA is applied to activate the implant.

RTA (Rapid Thermal Annealing to activate the N and P dopants that were implanted.

Oversize mask—Resist to cover total area except slightly bigger than the intrinsic bases of NPN and PNP.

Oxide etch the oversize intrinsic base oxide of the NPN and PNP. H20:HF (10:1) 10 second dip prior to polysilicon II. Polysilicon II must be deposited immediately after this dip; therefore the polysilicon Dep system must be ready to receive, the etch done, the boats loaded and placed in the polysilicon system ASAP. The idea is to have a controlled generic oxide prior to polysilicon II. This will ensure control of beta.

Figure 5A:
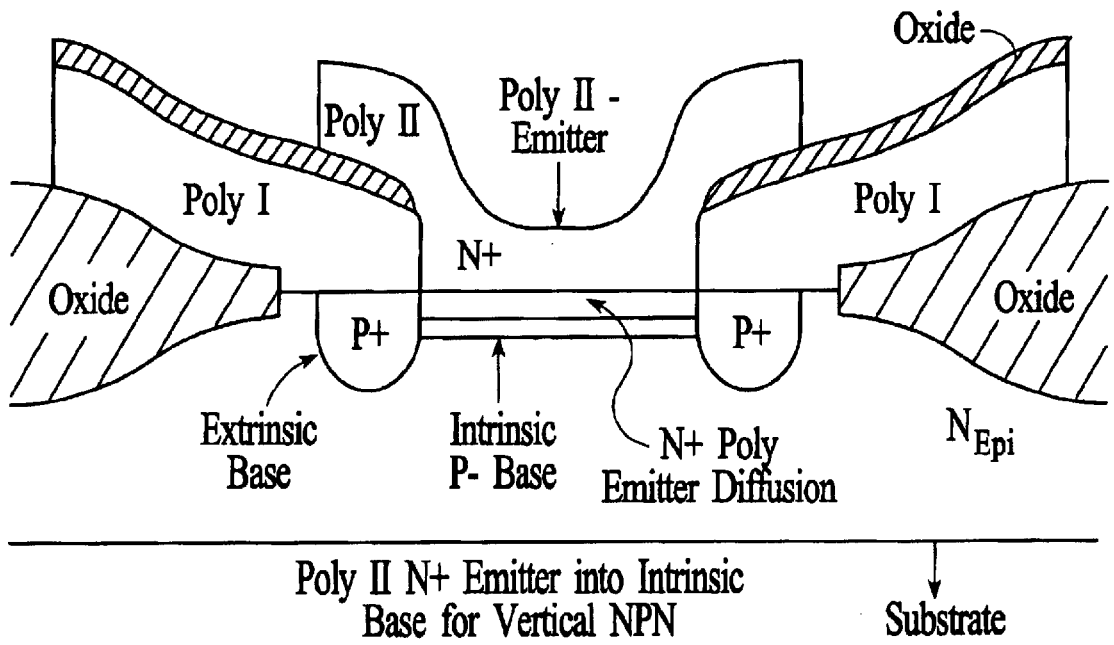
FIG. 5A is a cross section of the device after poly 2 self aligned emitter masking and RTP drive of the vertical NPN and showing how it positions itself relative to the extrinsic and intrinsic base of the vertical NPN.
Figure 5B:
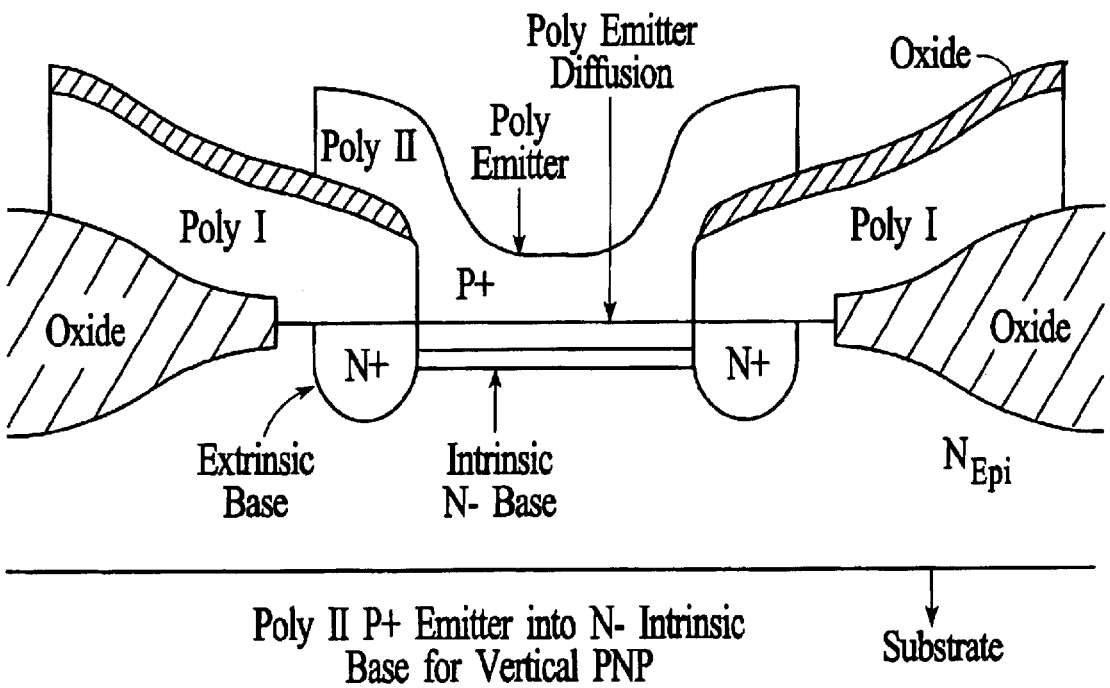
FIG. 5B is a cross section of the device after poly 2 self aligned emitter masking and RTP drive of the vertical PNP emitter and shows how the emitter self aligns relative to the extrinsic and intrinsic base of the vertical PNP.

Deposit polysilicon II. Standard polysilicon thickness over the intrinsic base of NPN and PNP. FIG. 5A is a cross section of the device after poly 2 self-aligned emitter masking and RTP drive of the vertical NPN and showing how it positions itself relative to the extrinsic and intrinsic base of the vertical NPN. FIG. 5B is a cross section of the device after poly 2 self-aligned emitter masking and RTP drive of the vertical PNP emitter and shows how the emitter positions itself relative to the extrinsic and intrinsic base of the vertical PNP.

N emitter mask—slightly oversize—resist only for implant as shown in FIG. 5A.

Implant N dopant for emitter of NPN as shown in FIG. 5A. Strip resist.

P emitter mask—slightly oversize—resist only for implant as shown in FIG. 5B.

Implant P dopant for emitter of PNP as shown in FIG. 5B. Strip resist

Polysilicon II emitter mask—slightly oversize for emitters of NPN and PNP as shown in FIGS. 5A and 5B.

Polysilicon etch to leave polysilicon over Intrinsic Base of NPN and PNP, slightly oversize. See FIGS. 5A and 5B.

Polysilicon oxidation to drive in the emitters for the NPN and PNP transistors.

This completes the combination of steps that provide the self-aligned extrinsic and intrinsic bases as well as the controlled polysilicon emitters and diffusions for the NPN and PNP transistors.

Processing from this Point to Completion

After completion of the polysilicon etch, the process is the same as the conventional process. This includes any polysilicon oxidations, dielectric depositions, contact openings, etc. It also depends on whether decision is made to choose the approach of an isoplanar structure or a shallow trenched approach (STI). Whichever of these approaches is used, it can be made compatible with the slot approach of the buried power buss that will now be discussed.

Processing of the Buried Power Buss

Figure 6:
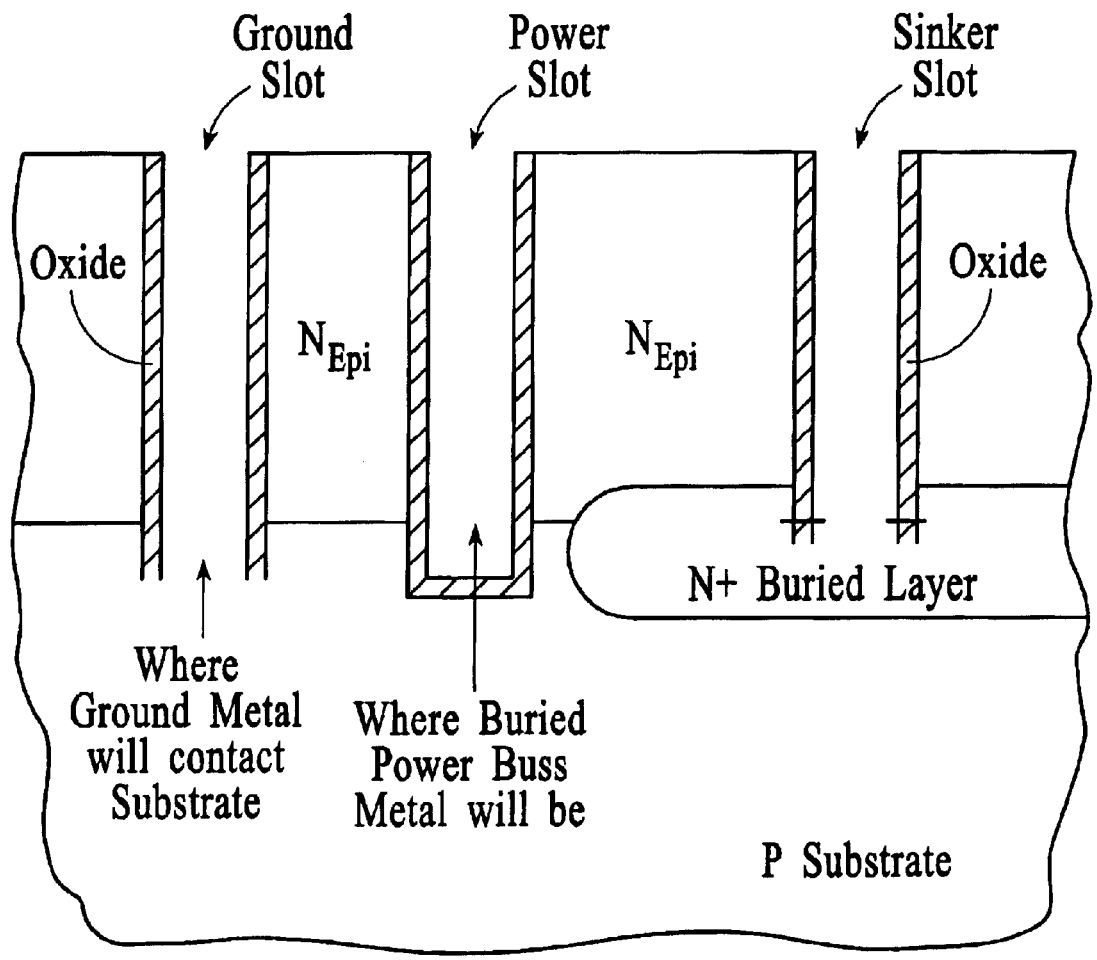
FIG. 6 is a cross section of the slots after oxidation and removal of the oxide at the bottom of the slots intended for ground.

The example being described uses slots that are 5 $\mu$m wide and 5–6 $\mu$m deep. This is to be compatible with epitaxial layer that is 5–6 um thick with a buried layer that out-diffuses 3 $\mu$m into the epitaxial layer during the epitaxial deposition and is approximately 3 um into the substrate. This results in the epitaxial layer being 5 um thick where there is no buried layer and approximately 3 um thick where the buried layers are located. In this case the slots XXXX will accommodate a penetration into the buried layer where the buried layer exists and through the epitaxial material to the substrate where no buried layer exists. FIG. 6 is a cross section of the slots after oxidation and removal of the oxide at the bottom of the slots intended for ground. It shows the power buss slot surrounded by oxide and the sinker slot with the oxide removed to allow contact to the N+ buried layer. It is important to realize that the width of the slots is dependent on the user. The slots can be widths of a few microns to greater than 10 microns depending on the design and the capabilities of the fabricator.

Slot Masking

Figure 7:
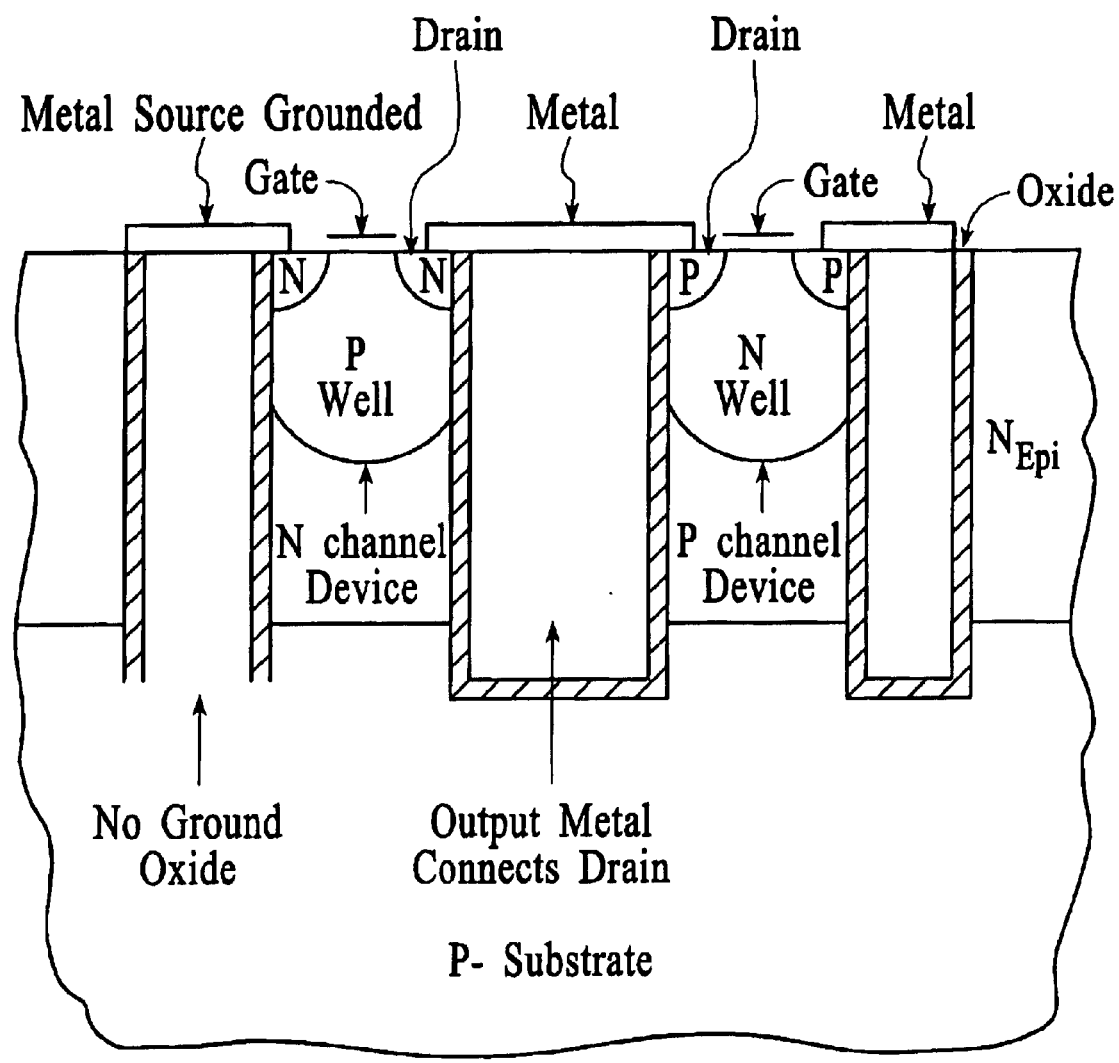
FIG. 7 is a cross section of the slots as they relate to the CMOS device in a BiCMOS, BCD or other technologies requiring CMOS devices.

Next the slots are defined. Resist is applied and the slot mask patterned. Slots will be required at all ground points, all sinkers or drains, and all power supply busses. If used in a BiCMOS or CMOS process, slots will be completed as shown in FIG. 7. This includes the inner extremities where the power output node of the buss is to be located. This node is common with the buss from the drains of the P channel XXXX to the drains of the N channel device. Note that a unique structure is formed for the CMOS. The oxidized and metal filled slots are used to truncate the adjacent P well and N wells thus providing a structure that is independent of the spacing between the two wells. They could be designed to be touching and the slots separate them while isolating them with the oxide in the periphery of the slots.

Nitride/Oxide etch (dry) is utilized to etch through nitrides and oxides at the locations of ground, Sinker/drain, and power supply buss. FIG. 7 is a cross section of the slots as they relate to the CMOS device in a BiCMOS, BCD or other technologies requiring CMOS devices. It shows the oxide removed from the slot that goes to ground and connects the source of the N channel device to ground. It shows how this unique approach truncates the wells and drains of the P channel and N channel devices while providing a metal output and results in a much smaller device for given critical design rules and dimensions. An AMT Centura Plasma Etcher or equivalent may be used in a single operation to etch any oxide, nitride or Silicon in this step of the process.

Silicon etch—etch with AMT Centura or equivalent. Slots can be etched 3 $\mu$m to 8 $\mu$m (in this example) deep and the width is determined by the mask dimension and remains approximately the same as the mask critical dimensions.

Oxidation—Slots are oxidized as shown previously in FIG. 6. Oxide thickness to be determined by the product requirements. Oxidation is performed, in a preferred embodiment, at just over 900 C. In certain applications where a limited thermal budget is present, the dielectric can be a deposited one that is conformal.

Slot Implant Mask (ground strap)—a resist mask that covers the buried power buss, and collector/drain slot locations is provided. Resist is developed out at the ground locations and any active area where a ground is needed.

Oxide etch—The oxides are etched at the grounding points exposed by the slot implant mask.

Implant boron into ground slots and exposed regions where boron is required for making good low resistance contacts for subsequent metal interconnects.

A preferred oxide etch is completed at this point; oxide was not etched in the previous oxide etch step in order to allow for an oxide buffer for the boron implant to be completed.

Figure 8:
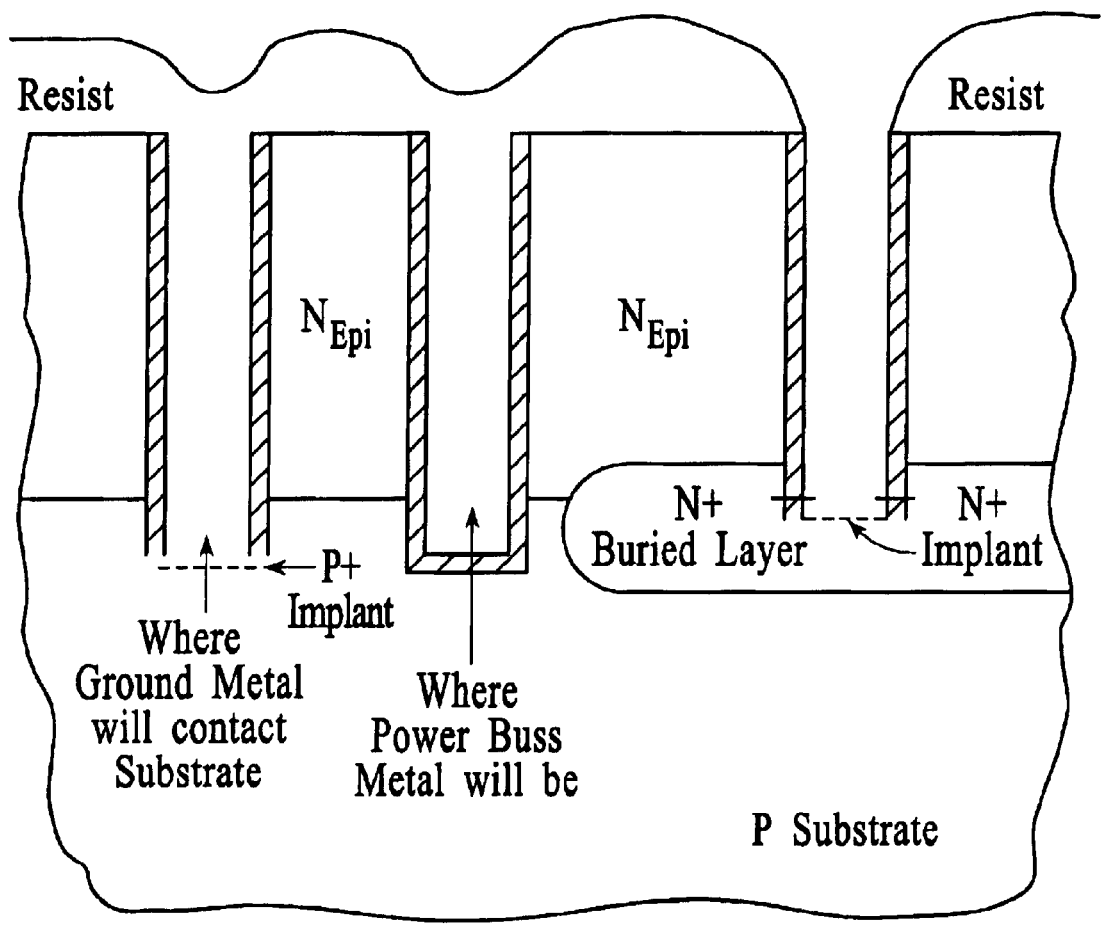
FIG. 8 is a cross section of the three uses of the various slots; i.e., Ground slots that have the bottom oxide removed and make contact to the substrate for Ground, Sinker slots that have the bottom oxide removed and make contact to the buried layer, Power Buss Slots that are surrounded by oxide and are therefore isolated from other structures.

See FIG. 8 which shows the implants into the ground slot (P+ implant) and the sinker slot (N+ implant).

Slot Implant Mask (Sinker/Drain)—A resist mask is provided that covers everything but sinker/drain slots. FIG. 8 is a cross section of the three uses of the various slots. One slot with the oxide removed from the bottom has a P+ implant so as to make a low resistance contact to the substrate (ground) when the metal fills the slots. One slot has the oxide remaining at the bottom of the slot and this will provide the slot for the buried power buss when the metal fills this slot. The remaining slot type is the one where the oxide is removed from the bottom of the slot that makes contact to the buried layer. Note that this slot shows an N+ implant that allows the metal that will fill that slot to make a low contact to the buried layer forming a low resistance sinker for the collector of the bipolar transistor. This same type of slot could also be used for a drain of a CMOS to make a low resistance contact.

Implant n+ into the sinker/drain locations through oxide at these locations. Strip oxide in sinker locations to expose the implanted region that connects to the buried layer. The resist is stripped.

Rapid thermal anneal (RTA) to activate and slightly drive the boron into the substrate at ground locations previously implanted and the phosphorus to sinker/drain locations as provided.

Sputter etch "in situ" (to round off the corners of the slot oxides and prepare the surface) followed by sputter deposition of Metal 1A (AlSiCu)—2.5 um thick.

Next, metal planarization takes place.—Maskless metal preparation.

Resist is applied to cover the wafers.

The wafers are planar etched to remove the resist and metal from the field. This leaves resist covering metal 1A in the slots (where the resist is thicker and isn't removed during the planar etching).

Figure 9:
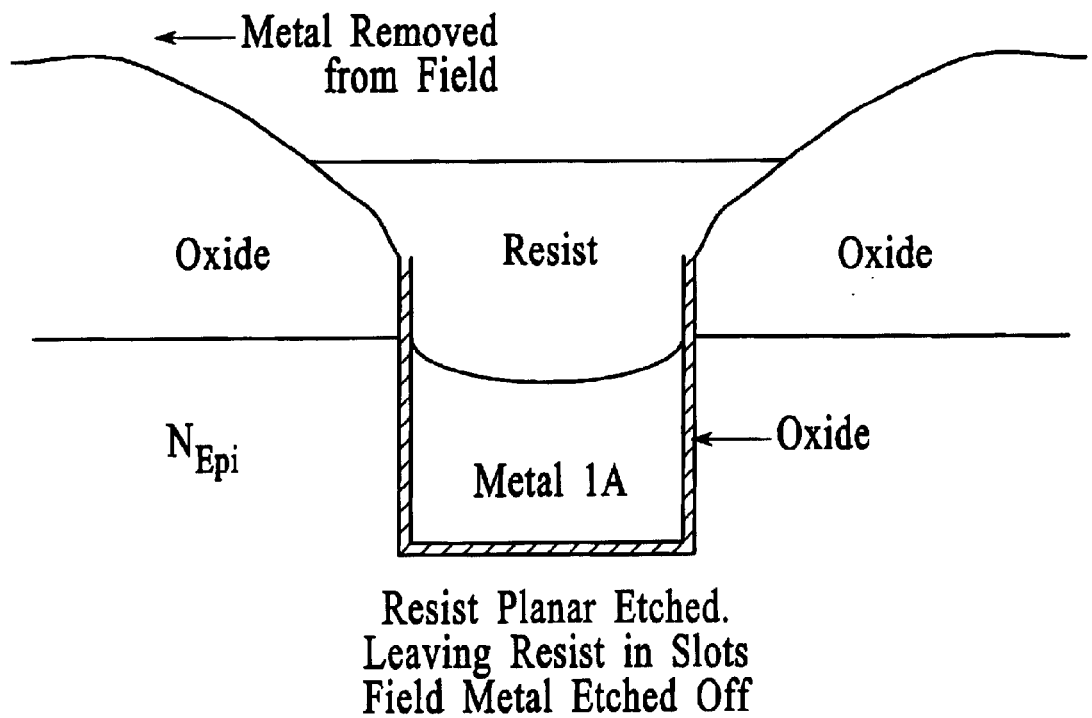
FIG. 9 is a cross-section of the metal 1A layer after the field has been planarized and the metal removed from the field leaving remaining resist in the slot above the 1A metal.

The resist is stripped. FIG. 9 is a cross section of the metal 1A layer after the field has been planarized and the metal removed from the field leaving remaining resist in the slot above the 1A metal. It is important to note at this point that instead of resist being applied and the wafers planarized, it may be preferable to apply spun on glass (SOG) as the material to be etched along with the metal.

Figure 10:
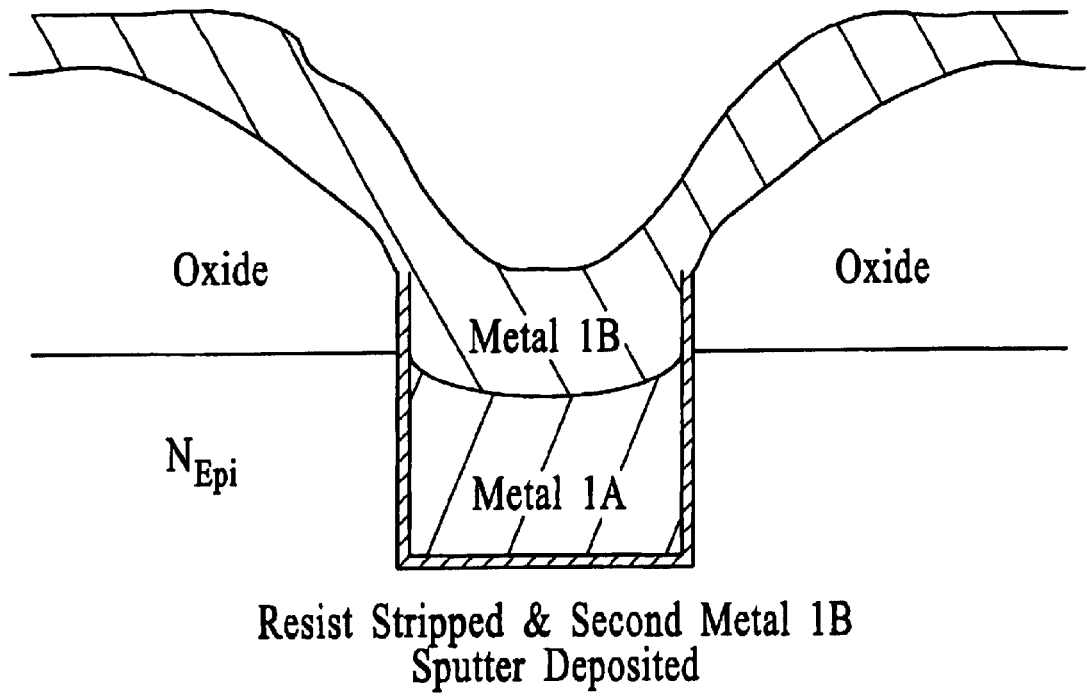
FIG. 10 is a cross-section of the metal 1A and 1B after metal 1B has been deposited.

Sputter etch "in situ" followed by 2.5 um of metal 1B deposition. This leaves 5 $\mu$m in the slots and 2.5 $\mu$um in the field. FIG. 10 illustrates resist stripped above metal 1A and the metal 1B deposition. FIG. 10 is across section of the metal 1A and 1B after metal 1B has been deposited.

Metal Planarization Maskless metal preparation

Resist is applied (or SOG) that covers the wafers.

The wafers are planar etched to remove the resist (or SOG) and metal from the field. This leaves resist covering metal 1B in the slots.

The resist is stripped leaving metal 1A and 1B in the slots.

Deposit TEOS dielectric; thickness to be determined by product being fabricated.

Contact and buss mask. Deposit resist. Masking to pattern open contacts of normal interconnect circuitry and to open with the use of many contacts, the dielectric above all slots that contain metal 1A and 1B where metal 1C is desired to make contact to metal 1B. It is important to note that the contact sizes are all the same size. Thus to make good contact to the busses a multiplicity of contacts are made over these structures.

Sputter etch "in situ" etch and deposit metal 1C.

Interconnect Metal Mask

Resist is applied.

Figure 11:
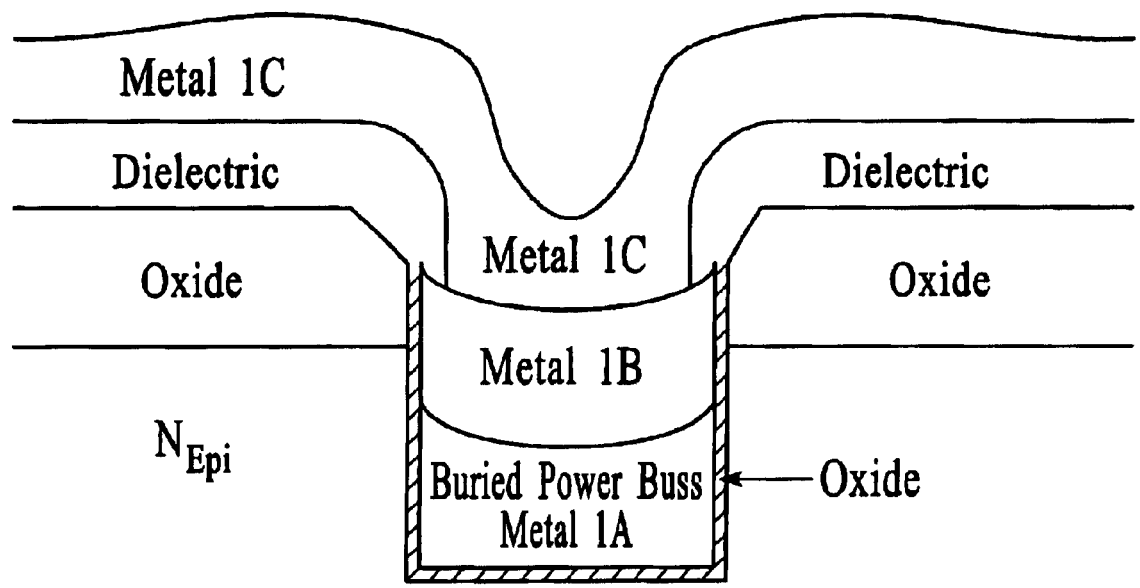
FIG. 11 is a cross-section of the metal 1A, 1B, and 1C and shows the dielectric that is between layer 1B and 1C except where one wants 1C to make contact as shown in the Figure.

Interconnect and slot mask exposed. A standard metal patterning is done for the interconnects and the buss while only having to etch 2.5 μm of metal of the 1C layer as shown in FIG. 11. FIG. 11 is across section of the metal 1A, 1B, and 1C and shows the dielectric that is between layer 1B and 1C except where one wants 1C to make contact as shown in the Figure. This leaves 7.5 μm of metal in the slots and 2.5 μm of metal in the field interconnect pattern. Leave overlap of approximately 1.0 um of metal bordering the slots to ensure not etching into slots while etching the metal.

Metal alloy—Metal is alloyed using standard alloying procedure. Completed in forming gas (Hydrogen present) to provide an Anneal of the metal to reduce (eliminate) fast surface states.

Figure 12:
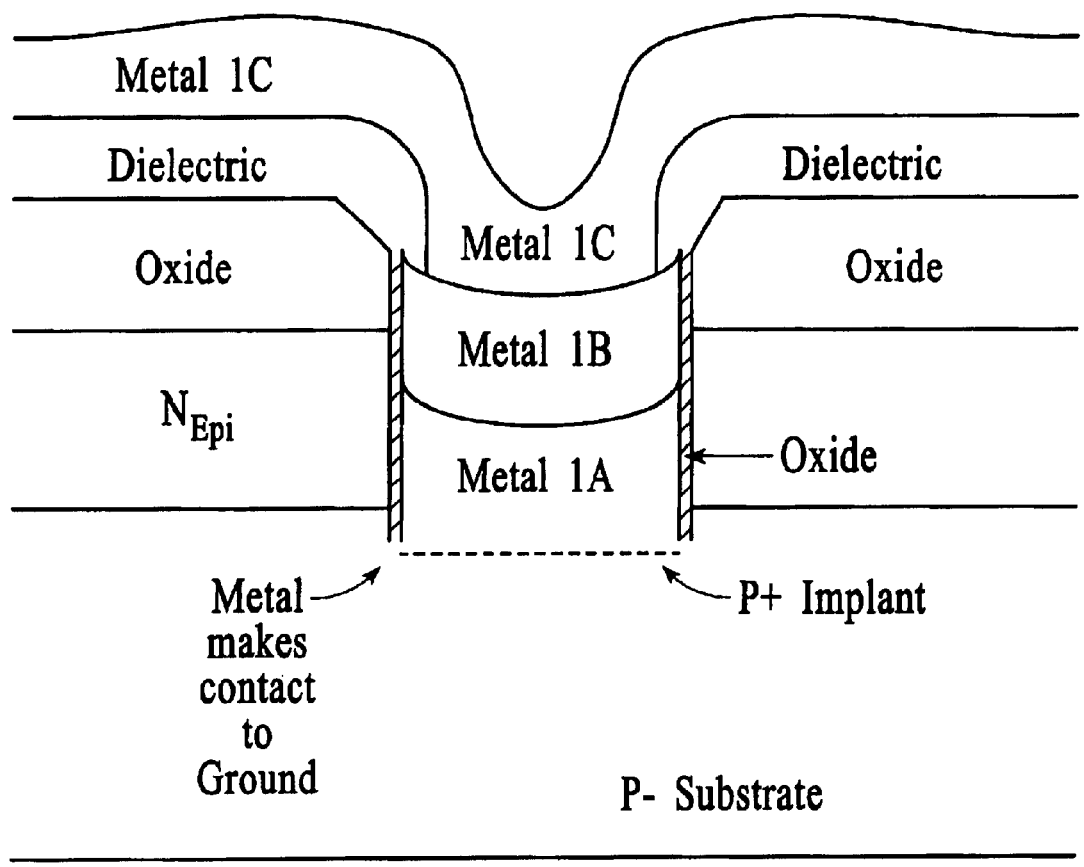
FIG. 12 is essentially the same as FIG. 11 except this shows the slot that has the oxide removed from the bottom and a P+ implant making contact to the substrate (ground).

Approximately 7 um of metal in the slots and 2.5 um of metal are now in the interconnects. It is important to note that the 1C metal could have been 1 um thick to facilitate the etching of narrow geometries. If 1 um is used for the 1C layer the metal in the slots will be approximately 6 microns thick. Where oxide has been removed from the bottom of slots such as grounds, sinkers, and drains, the metal will make direct contact to the boron P+ ground and to the phosphorus/arsenic N+ to the buried layer. See FIGS. 12 and 13. FIG. 12 is essentially the same as FIG. 11 except this shows the slot that has the oxide removed from the bottom and a P+ implant making contact to the substrate (ground). This shows that the ground is isolated from adjacent areas by the oxide of the slot on the sides.

Where oxide was not removed from the bottom of slots one has slots filled with metal and surrounded by oxide on the bottom and all sides and TEOS dielectric on the topside.

Figure 13:
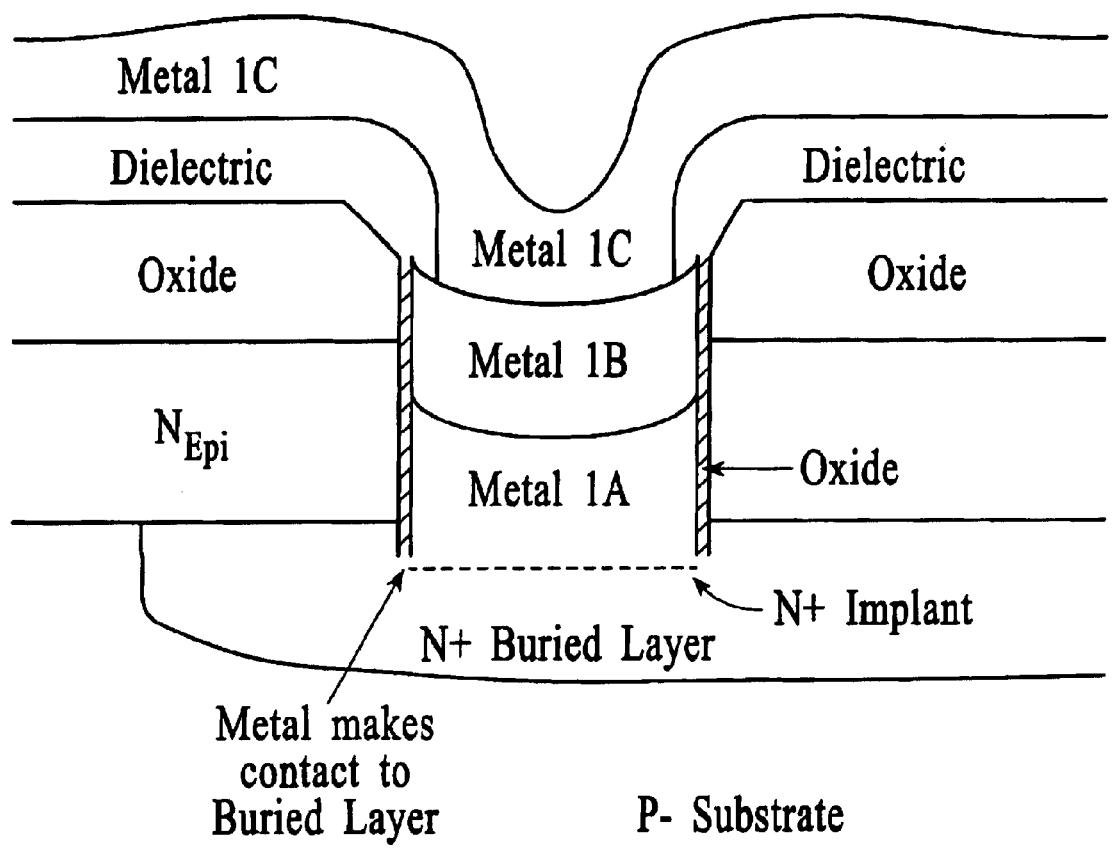
FIG. 13 is essentially the same as FIG. 11 except this shows the slot that has the oxide removed from the bottom so as to make contact to the buried layer.

There is now have 7.5 um of metal in the sinkers/drains slots that, with 5 um of epitaxial, will make contact to the up diffused buried layer as shown in FIG. 13. FIG. 13 is essentially the same as FIG. 11 except this shows the slot that has the oxide removed from the bottom so as to make contact to the buried layer. Note an N+ implant is shown so as to make a low resistance contact to the buried layer. With 5 um of epitaxial the oxidized slots make it through the epitaxial layer to the substrate as shown in FIG. 12, allowing the isolation mask and high temperature diffusion to be eliminated and isolation to be gained through oxide isolation of these oxidized slots.

The buried power buss has oxide surrounding its slots and is therefore isolated from all regions except where the buss is going into the power pick up points of the circuit. These pick up points are contacted by the 1C metal or by the total slot metal where applicable.

Figure 14:
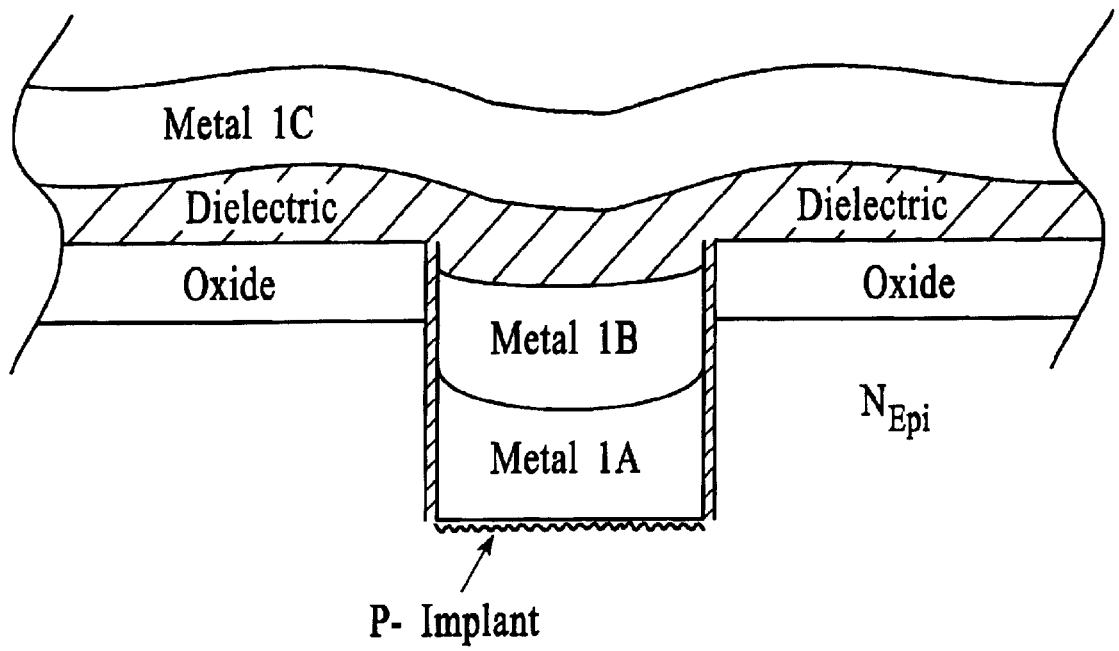
FIG. 14 is a cross section that shows where metal 1C crosses over a ground buss and is isolated from that ground buss by the dielectric (shown as TEOS in this example).

When proceeding from one isolated island to another the power buss may need to cross ground. In these specific spots the ground does not have metal 1A, 1B, and 1C all stacked on each other. There is the TEOS between metal 1B and 1C as shown in FIG. 14. FIG. 14 is a cross section that shows where metal 1C crosses over a ground buss and is isolated from that ground buss by the dielectric (shown as TEOS in this example). This is typical of when a metal power buss is going from one isolated epitaxial island to another and one wants it to be isolated from the ground buss. This bridge crossover is only about 5–10 μm wide to accommodate the 1C metal to pass over from one epitaxial island to the next epitaxial island carrying power and isolating from ground metal at these points. Just before and just after the metal crosses over these isolated ground spots, the metal width returns to its full width. The metal only necks down to pass over these ground points and to limit any capacitive coupling between the power metal and ground.

An advantage to this approach is the fact that the substrate ground can be picked up anywhere a ground slot is processed. This means that many times one does not need to depend on metal 1C going from one ground point to another on the "surface". Instead, the ground can be connected through the substrate, going from one slot that makes ground contact to another slot that makes ground contact via the substrate. In this manner a significant amount of time is saved in the design of the devices since ground metal routing is eliminated. This is significant for the designers and their layout; providing them another avenue of freedom.

Further Processing

At this point, for many of the circuits, the product will be completed by depositing the topside and receiving the topside pad masks.

In most cases the classical second metal need not be provided since the slot metal provides two levels of metal. The two metal layers are achieved while only requiring one level of metal to be patterned and eliminating one level of dielectric deposition and a via masking and etching that is required in the classical two metal interconnect approach. These two levels of metal are obtained by using 1A and 1B (and in some places 1C also) as one layer of metal and the 1C as the other layer of metal. These two levels of metal are utilized in a manner that is opposite that of a classical two metal approach. In the classical approach the first metal is thin for carrying signals and the second metal is thick and is used for carrying the highest current. With the buried power buss approach the 1C metal interconnect layer acts as a second layer of metal and only needs to carry the low current signals. Heavier currents are handled by the combination of 1A, 1B and 1C metal that provide very thick metal in the slots. The 1C metal layer has been selected to be 2.5 um thick in this example. However, since it doesn't carry high current and can be much thinner, one micron could be used which makes the masking and etching of the interconnect layer easier. However, thinning this metal results in the slot metal also not being 7.5 um thick. Therefore, one has to determine how thick to make the 1C metal based on their capabilities and the products requirements.

Adding Additional Metal Layers

For products that require an additional metal, this is easily accommodated, but should have been considered while processing up through the points indicated above for single metal. When one knows that a third layer of metal (Layer 2A in the buried layer approach) is required the thick oxide in the field should have been planarized to a thinner layer after metal 1A (prior to metal 1B). This will be discussed.

After metal 1A is deposited and the thick resist applied to protect the slots and metal 1A etched from the field, leave the resist in the slots and spin normal viscosity resist and planar etch the wafers with an oxide etch to reduce the height of the field oxide, etc. CMP could be used at this point to planarize the wafer.

Deposit metal 1B and process as previously indicated above.

Deposit TEOS directly as previously described.

Contact and Buss Mask—Process as previously indicated above. Multi contacts are opened over the metal in the slots to provide many contacts to the metal and maintain the same contact size as is used for the normal contacts.

Sputter etch in situ followed by sputter deposition of 1C metal. Thickness to be determined by design and product requirements.

Interconnect and slot metal mask—Process as previously described above. Resist deposited. Interconnect and slot mask exposed. A standard metal patterning is done while only having to etch 2.5 um of metal of the 1C layer as shown in FIG. 14. This leaves approximately 7.5 um of metal in the slots and 2.5 um (or whatever is used for metal 1C thickness) in the interconnect pattern over the field oxide. Leave overlap of approximately 1.0 um of metal bordering the slots to ensure not etching into the slots.

Deposit approximately 9000 Å of TEOS, or a preferred dielectric.

Repeat planar etch procedure to further reduce the heights within the wafer. It may be preferable to do a CMP polish to provide an even flatter surface.

Via mask and etch. Where possible, vias of equal size should be placed into the buried power buss and ground straps many times. This is to ensure that all the vias are etched open at the same time. Contact of second metal (metal 2A) to the 1C metal or other metal layers will be through numerous contacts of a given size. This will provide the equivalent of 10 microns of metal for the buried power buss, the sinkers, the drains, and the grounds. This would provide even better locking of the grounds to provide an equal potential ground. The same is true for the power buss. In CMOS applications (BICMOS and CMOS) the metal is as shown in FIG. 7. This provides three levels of metal for interconnection and power while only having to process the equivalent of two metals if done the classical way. Therefore this approach has an advantage over the classical three metal approach by eliminating a dielectric deposition, a contact mask and etch, and an interconnect mask and etch.

In the steps described above, resist is used for the planarizing. It may be better to use SOG (Spun on Glass), depending on the equipment available.

The "second metal" is followed by topside dielectric and pad mask using the conventional processes.

Bonding Pads

The slots should be carried out to the eventual position of the bonding pads where layout permits this. These slots would have been processed when the others were. This would then have pads of metal that are 7.5 $\mu$m to 10 $\mu$m thick for the bonding pads. This is another advantage provided by the use of the buried slots. With all pads having this thick metal, it is like having an integrated metal "Heat Sink" and would allow heavier power dissipation in the chip. Thicker metal in the pads also results in more latitude in bonding during assembly.

Since the wafers are fairly well flat through the planarizing steps, it provides a good surface for additional metal layers if required.

This completes the general and generic approach to providing a self aligning, complementary output with poly-silicon emitters and buried power buss. This results in bipolar transistors with a high gain, low to high power, high early voltage, efficient power capability, efficient use of chip area with excellent heat transfer characteristics and a much smaller chip than would have been achieved without the unique processing and structures as described.

The process flow described was for a bipolar approach. When the CMOS is used in a BICMOS approach, a BCD approach, and EDLDMOS or a Power Lateral PNP is required then the Pwell and Nwell, or Deep P processing needs to be added. The advantage of the approach just discussed is that critical spacings such as the distance between wells, the distance from drains to the edge of the wells, the distance from the edge of wells to the sources, and the area used for the output of the CMOS become non-critical. This can be seen in FIG. 7. This latitude is allowed because the slots used for the buried power buss are used to truncate the wells. Since the slots are oxidized it provides an oxide isolation between wells. It also provides an oxide isolation from drains to the edge of wells and it provides a direct ground from the source of the N channel (or P channel where desired) to the substrate; through the slots that have the oxide removed from the bottom. The metal in the slots makes direct contact to the substrate. With these advantages the CMOS becomes much smaller for given process and design rules since critical spacing is eliminated in most cases.

Conclusion

The process and device in accordance with the present invention provides several advantages:

1. Complementary outputs use no power while there is no signal. This is especially desired in battery operated applications. This allows the device to operate at lower power and lower temperatures for a given function.
2. Use of the self aligned polysilicon emitters allows for the reduction of the base and emitter size of the bipolar devices, thus resulting in smaller active areas and a higher $F_t$.
3. Self aligned polysilicon emitters and self aligned intrinsic and extrinsic bases are utilized in the present invention, resulting in very high beta while providing a minimum sized die.
4. Because the intrinsic base resistance is controlled to low values and results in a low Rb', this approach results in high $F_{max}$.
5. Use of poly to control the size of the intrinsic base, the extrinsic base, and the poly emitter provides precision control of the areas of the PNP relative to the NPN. Therefore they can be precision ratioed to eliminate the differences between the mobilities of the electrons and holes in these structures.
6. By controlling the Root $D_{t(time\ and\ temperature)}$ of the process at several key locations, the technology in accordance with the present invention provides a high early voltage ($V_A$). This combination will allow a high Beta $V_A$ product at low die area usage. Part of the temperature control is derived from use of the buried power buss concept which results in elimination of both the sinker and isolation masking and diffusion. Sinker and isolation masking and diffusion are the highest temperature and longest time operations and dropping them allows for reduction and better control of the Root $D_t$ of the process.
7. The high Beta $V_A$ combination along with the complementary output allows for low power internal operation, excellent current sources, high voltage gain, high voltage swings, high power efficiency, and can be utilized in either a "current supply" or "current sinking" mode.

8. Depending on the location of the PNP relative to the NPN in the output, the device will be able to work off of a single or a dual power supply. Working off of a dual power supply has advantages for certain applications.

9. Utilization of the buried power buss results in isolation by an oxide covered metal tied to ground as well as a sinker that is provided by an oxide covered metal. This allows for the isolation and sinker to be moved closer to each other and closer to the extrinsic base of the transistors. All of these movements result in a greatly reduced die size for any function, enabling reduced length of interconnects and lower resistance interconnects which result in lower RC time constants and therefore improved speed of operation.

10. Use of the polysilicon emitter and self-aligned extrinsic and intrinsic base, plus the utilization of the buried power buss, result in a device with the lowest Ron X area product. This is due to the shrinkage of spacing, the very low resistance to ground, the low resistance of the sinker/collector, the low resistance of the emitter connections and the increased thickness of the metal in the buried power busses while only requiring standard metal patterning for interconnects.

11. When used with a product that requires an epitaxial thickness of less than 6 μm, the buried layer masking process can be eliminated.

12. The combined polysilicon and buried power buss approach results in reduced masking and a very straightforward, easily controlled process for achieving the results targeted. There are no critical process steps in this approach other than assuring a good clean surface prior to second polysilicon deposition.

13. Utilization of the buried power buss results in a very significant reduction in the size of any CMOS structure used in BiCMOS or CMOS design. The Ron X area is significantly reduced below other that achieved utilizing other approaches. The use of the buried power buss throughout provides an advantage for all the technologies.

14. The use of the buried power buss results in a significant reduction in the size of any Lateral PNPs used in any of the technologies as well as improved Beta and frequency response for the PNP when using the same masking and processing tolerances.

Overview

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A bipolar output stage comprising:

a semiconductor substrate, the semiconductor substrate including NPN and PNP transistors; and a buried power buss on the semiconductor substrate, the buried power buss comprising at least one slot provided in the semiconductor substrate and at least one metal within the slot.

2. The bipolar output stage of claim 1 wherein the semiconductor substrate comprises:

a substrate region; and a buried layer, or Boron Up Diffusion where required and an epitaxial (EPI) layer over the substrate region, wherein the device structures are provided in the EPI layer.

3. The bipolar output stage of claim 2 wherein the at least one metal comprises a plurality of metals.

4. The bipolar output stage of claim 3 wherein the plurality of metals comprises two metals, a first metal covers one-half of the slot and a second metal fills the slot.

5. The bipolar output stage of claim 4 wherein the plurality of metals comprises three metal depositions, wherein the first and second deposition of metal fill the slot and a third metal deposition provides the interconnect layer.

6. The bipolar output stage of claim 1 wherein the at least one metal is provided utilizing chemical vapor deposition.

7. The bipolar output stage of claim 1 wherein the at least one metal is provided utilizing sputter depositions.

* * * * *